(12) United States Patent
Littecke et al.

(10) Patent No.: US 8,318,293 B2
(45) Date of Patent: *Nov. 27, 2012

(54) COATED CUTTING TOOL INSERT

(75) Inventors: Peter Littecke, Huddinge (SE); Björn Ljungberg, Enskede (SE)

(73) Assignee: Sandvik Intellectual Property AB, Sandviken (SE)

( * ) Notice: Subject to any disclaimer, the term of this patent is extended or adjusted under 35 U.S.C. 154(b) by 718 days.

This patent is subject to a terminal disclaimer.

(21) Appl. No.: 11/454,127

(22) Filed: Jun. 16, 2006

(65) Prior Publication Data

US 2007/0009763 A1 Jan. 11, 2007

(30) Foreign Application Priority Data

Jun. 17, 2005 (SE) ........................................ 0501410

(51) Int. Cl.
*B32B 9/00* (2006.01)

(52) U.S. Cl. ............ 428/216; 51/307; 51/309; 428/212; 428/336; 428/472; 428/698; 428/701; 428/702

(58) Field of Classification Search ................... 51/307, 51/309; 428/212, 216, 336, 472, 698, 701, 428/702

See application file for complete search history.

(56) References Cited

U.S. PATENT DOCUMENTS

| | | | |
|---|---|---|---|
| 2,350,440 A | 6/1944 | Almen | |
| 4,497,874 A | 2/1985 | Hale | |
| 4,643,620 A | 2/1987 | Fujii et al. | |
| 4,966,501 A * | 10/1990 | Nomura et al. | 428/698 |
| 5,487,625 A * | 1/1996 | Ljungberg et al. | 51/309 |
| 5,536,336 A | 7/1996 | Nakatsukasa et al. | |
| 5,654,035 A | 8/1997 | Ljungberg et al. | |
| 5,702,808 A | 12/1997 | Ljungberg | |
| 5,766,782 A | 6/1998 | Ljungberg | |
| 5,786,069 A | 7/1998 | Ljungberg et al. | |
| 5,851,687 A | 12/1998 | Ljungberg | |
| 5,861,210 A | 1/1999 | Lenander et al. | |
| 5,863,640 A * | 1/1999 | Ljungberg et al. | 428/216 |
| 5,945,207 A | 8/1999 | Kutscher et al. | |
| 6,015,614 A | 1/2000 | Ruppi | |
| 6,200,671 B1 | 3/2001 | Lindskog et al. | |
| 6,333,098 B1 * | 12/2001 | Olsson et al. | 428/472 |
| 6,333,100 B1 | 12/2001 | Palmqvist et al. | |
| 6,344,264 B1 | 2/2002 | Lenander et al. | |
| 6,554,548 B1 | 4/2003 | Grab et al. | |

(Continued)

FOREIGN PATENT DOCUMENTS

DE 197 52 644 A1 6/1998

(Continued)

OTHER PUBLICATIONS

Noyan et al., "Residual Stress: Measurement by Diffraction and Interpretation," Springer-Verlag, pp. 117-129.

(Continued)

*Primary Examiner* — Archene Turner
(74) *Attorney, Agent, or Firm* — Morgan, Lewis & Bockius LLP

(57) ABSTRACT

The present invention relates to a CVD-coated cutting tool insert with a $TiC_xN_y$-layer with a low tensile stress level of from about 50 to about 390 MPa and an $\alpha$-$Al_2O_3$-layer with a high surface smoothness with a mean Ra<0.12 μm as measured by AFM-technique. This is obtained by subjecting the coating to an intensive wet blasting operation.

16 Claims, 1 Drawing Sheet

U.S. PATENT DOCUMENTS

| | | | |
|---|---|---|---|
| 6,869,334 | B1 | 3/2005 | Leyendecker et al. |
| 6,869,668 | B2 | 3/2005 | Mårtensson |
| 6,884,496 | B2 | 4/2005 | Westphal et al. |
| 7,090,914 | B2 * | 8/2006 | Yamagata et al. ............ 428/698 |
| 7,163,735 | B2 | 1/2007 | Ruppi |
| 7,306,636 | B2 * | 12/2007 | Ljungberg ...................... 51/307 |
| 7,416,778 | B2 | 8/2008 | Westergren et al. |
| 7,655,293 | B2 * | 2/2010 | Ljungberg ................... 428/698 |
| 7,754,316 | B2 * | 7/2010 | Littecke et al. .............. 428/216 |
| 2003/0104254 | A1 | 6/2003 | Westphal et al. |
| 2006/0204757 | A1 | 9/2006 | Ljungberg |
| 2007/0009763 | A1 | 1/2007 | Littecke et al. |
| 2007/0020393 | A1 | 1/2007 | Ljungberg |
| 2007/0298281 | A1 | 12/2007 | Andersson et al. |
| 2007/0298282 | A1 | 12/2007 | Andersson et al. |
| 2008/0107882 | A1 | 5/2008 | Littecke et al. |
| 2009/0068371 | A1 | 3/2009 | Littecke et al. |

FOREIGN PATENT DOCUMENTS

| | | |
|---|---|---|
| EP | 0 298 729 | 1/1989 |
| EP | 0 603 144 | 6/1994 |
| EP | 0 659 903 A1 | 6/1995 |
| EP | 0 659 906 A1 | 6/1995 |
| EP | 0693574 B1 | 1/1996 |
| EP | 0 736 615 | 10/1996 |
| EP | 0 753 603 B1 | 1/1997 |
| EP | 1 247 789 A2 | 10/2002 |
| EP | 1 306 150 | 5/2003 |
| EP | 1 464 727 A2 | 10/2004 |
| EP | 1 825 943 A1 | 8/2007 |
| JP | 60-184627 | 9/1985 |
| JP | 04-300102 | 10/1992 |
| JP | 4-300104 | 10/1992 |
| JP | 6-55311 | 3/1994 |
| JP | 1996-55311 | 3/1994 |
| JP | 6-114641 | 4/1994 |
| JP | 6-116641 | 4/1994 |
| JP | 6-330321 | 11/1994 |
| JP | 11-140647 | 5/1999 |
| JP | 2000-515588 A | 11/2000 |
| JP | 2002-370105 | 12/2002 |
| JP | 2003-25114 * | 1/2003 |
| JP | 2003-94230 | 4/2003 |
| WO | WO 98/28464 | 7/1998 |
| WO | 99/23275 A | 5/1999 |
| WO | WO 02/077312 A2 | 10/2002 |
| WO | WO 2006/135325 A1 | 12/2006 |
| WO | WO 2006/135330 A1 | 12/2006 |

OTHER PUBLICATIONS

Keneth J. A. Brookes, "World Dictionary of Hard Metals and Hard Materials", Sixth Edition, Hertfordshire, United Kingdom: International Carbide Data (1996) pp. 3 and 100 (ISBN 0 9508995 4 2).

ISO 8486-1, International Standard, "Bonded abrasives-Determination and designation of grain size distribution", 1996, pp. 1-5.

Jan Gleühmann, "Diplomarbeit", Experimentelle Untersuchugen zur Erhohung der Leistungsfahigkeit beschichteter Hartmetallwerkaeuge, 2004, pp. 54-57.

K. Weinert, "Spanende Fertigung", Essen: Vulan-Verlag GmbH, 2005, pp. V and 181-188.

"Theoretical (Geometrical) Surface Roughness," Surface Roughness (JIS B 0601-2001), R3, and pp. 2839-2840, 1994.

Schedler, Hartmetall für den Praktiker, Aufbau, Herstellung, Eigenschaften und Industrielle Anwendung einer modernen Werkstoffgruppe, Jul. 1988, pp. 43-57.

Mitsubishi CArbide, Wende-Schneidplatten, Mitsubishi Materials Corporation.

"Definitions and Designation of Surface Roughness," JIS B 0601, 0601, 1982, Japanese Industrial Standards Committee, 1982.

Roebuck, "Magnetic Moment (Saturation) Measurements on Hardmetals," Int. J. of Refractory Metals & Hard Materials, 14, 1996, pp. 419-424.

Grounds for Appeal for European Application/Patent No. 06445001.8/1696051, dated May 2, 2012.

Cemented carbide glossary in Japanese (E25) (as referenced in translator's verification statement to JP 6-55311), 1984.

Kyocera catalogue (E22), 2005-2006.

W Maritzen et al., "Lattice Parameters and Saturation Magnetism of Co-W-C Alloys", Powder Metallurgy International, vol. 17, No. 2, 1985, p. 68-71.

Derek Craik, Magnetism, Principles and Applications, John Wiley and Sons, ISBN 0-471-954179 (1995).

* cited by examiner

COATED CUTTING TOOL INSERT

BACKGROUND OF THE INVENTION

The present invention relates to a high performance coated cutting tool insert particularly useful for turning of steel, like low alloyed steels, carbon steels and tough hardened steels at high cutting speeds. The insert is based on WC, cubic carbides and a Co-binder phase with a cobalt enriched surface zone giving the cutting insert an excellent resistance to plastic deformation and a high toughness performance. Furthermore, the coating comprises a number of wear resistance layers which have been subjected to a surface post treatment giving the tool insert a surprisingly improved cutting performance.

The majority of today's cutting tools are based on a cemented carbide insert coated with several hard layers like TiC, $TiC_xN_y$, TiN, $TiC_xN_yO_z$ and $Al_2O_3$. The sequence and the thickness of the individual layers are carefully chosen to suit different cutting application areas and work-piece materials to be cut. The most frequent employed coating techniques are Chemical Vapor Deposition (CVD) and Physical Vapor Deposition (PVD). CVD-coated inserts in particular have a tremendous advantage in terms of flank and crater wear resistance over uncoated inserts.

The CVD technique is conducted at a rather high temperature range, 950-1050° C. Due to this high deposition temperature and to a mismatch in the coefficients of thermal expansion between the deposited coating materials and the cemented carbide tool insert, CVD can lead to coatings with cooling cracks and high tensile stresses (sometimes up to 1000 MPa). The high tensile stresses can under some cutting conditions be a disadvantage as it may aid the cooling cracks to propagate further into the cemented carbide body and cause breakage of the cutting edge.

In the metal cutting industry there is a constant striving to increase the cutting condition envelope, i.e., the ability to withstand higher cutting speeds without sacrificing the ability to resist fracture or chipping during interrupted cutting at low speeds, Important improvements in the application envelope have been achieved by combining inserts with a binder phase enriched surface zone and optimized thicker coatings.

However, with an increasing coating thickness, the positive effect on wear resistance is out balanced by an increasing negative effect in the form of an increased risk of coating delamination and reduced toughness making the cutting tool less reliable. This applies in particular to softer work piece materials such as low carbon steels and stainless steels and when the coating thickness exceeds about 5 to 10 μm. Further, thick coatings generally have a more uneven surface, a negative feature when cutting smearing materials like low carbon steels and stainless steel. A remedy can be to apply a post smoothing operation of the coating by brushing or by wet blasting as disclosed in several patents, e.g., EP 0 298 729, EP 1 306 150 and EP 0 736 615. In U.S. Pat. No. 5,861,210 the purpose has, e.g., been to achieve a smooth cutting edge and to expose the $Al_2O_3$ as the top layer on the rake face leaving the TiN on the clearance side to be used as a wear detection layer. A coating with high resistance to flaking is obtained.

Every post treatment technique that exposes a surface, e.g., a coating surface to a mechanical impact as, e.g., wet or dry blasting will have some influence on the surface finish and the stress state (σ) of the coating.

An intensive blasting impact may lower the tensile stresses in a CVD-coating, but often this will be at the expense of lost coating surface finish by the creation of ditches along the cooling cracks or can even lead to delamination of the coating.

A very intensive treatment may even lead to a big change in the stress state, e.g., from highly tensile to highly compressive as disclosed in U.S. Pat. No. 6,884,496, in which a dry blasting technique is used.

OBJECTS AND SUMMARY OF THE INVENTION

It is an object of the present invention to provide CVD-coated tool inserts with improved toughness properties.

In accordance with the invention, there is provided a coated cutting tool insert of cemented comprising a body having at least one rake face and at least one clearance face, said insert having a composition of from about 6.4 to about 8.6 wt-% Co, from about 4 to about 8.5 wt-% cubic carbides, balance WC, a CW-ratio in the range from about 0.78 to about 0.92 and having a surface zone of a thickness of from about 10 to about 35 μm, depleted of the cubic carbides TiC, TaC and/or NbC, said insert being at least partly coated with a from about 10 to about 25 μm thick coating including at least one layer of $TiC_xN_y$, and an α-$Al_2O_3$-layer being the outer layer at least on the rake face and that on said at least one rake face the $TiC_xN_y$-layer has a thickness of from about 5 to about 15 μm, and a tensile stress level of from about 50 to about 390 MPa, preferably from about 50 to about 300 MPa, the α-$Al_2O_3$-layer having a thickness of from about 3 to about 12 μm and being the outermost layer with an XRD-diffraction intensity ratio I(012)/I(024)≧1.3, preferably ≧1.5 and with a mean Ra value MRa<0.12, preferably ≦0.1 μm, at least in the chip contact zone on the rake face, as measured on ten randomly selected areas 10×10 μm² by AFM-technique and on said clearance face, the $TiC_xN_y$-layer has a tensile stress in the range from about 500 to about 700 MPa and the α-$Al_2O_3$-layer has an XRD-diffraction intensity ratio I(012)/I(024)<1.5, or on said at least one rake face and said at least one clearance side, the $TiC_xN_y$-layer has a thickness of from about 5 to about 15 μm, and a tensile stress level of from about 50 to about 390 MPa, preferably from about 50 to about 300 MPa and the α-$Al_2O_3$-layer with a thickness of from about 3 to about 12 μm, has an XRD-diffraction intensity ratio I(012)/I(024)≧1.3, preferably ≧1.5 and on the rake face is the outermost layer with a mean Ra value MRa<0.12, preferably ≦0.1 μm, at least in the chip contact zone on the rake face, as measured on ten randomly selected areas 10×10 μm² by AFM-technique and on said clearance face, the top layer consists of a colored heat resistant paint or a colored PVD-layer.

DETAILED DESCRIPTION OF THE PREFERRED EMBODIMENTS

Figure 1:
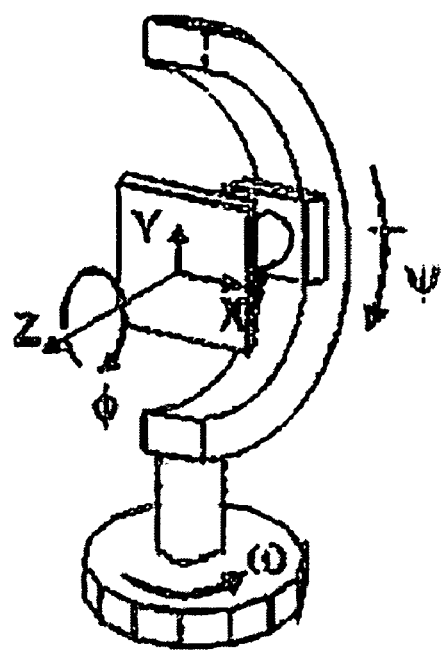
FIG. 1 shows a goniometer set-up for the evaluation of residual stress by X-ray measurements in which
E=Euler ¼-cradle
S=sample
I=incident X-ray beam
D=diffracted X-ray beam
θ=diffraction angle ω=θ
ψ=tilt angle along the Euler ¼-cradle
Φ=rotation angle around the sample axis

It has now been found that a cutting tool insert with surprisingly improved cutting performance particular in steel can be obtained if one combines a certain cemented carbide composition with a certain coating structure and thickness and then post treats the coated insert by wet-blasting under controlled tough conditions.

The cobalt binder phase is highly alloyed with W. The content of W in the binder phase can be expressed as the CW-ratio:

$$CW\text{-ratio}=M_s/(\text{wt-\% Co}*0.0161)$$

wherein $M_s$=measured saturation magnetization in $hAm^2/kg$ and wt-% Co is the cobalt content in the cemented carbide. A low CW-ratio corresponds to a high W-content in the Co binder phase. The employed post treatment will give the coating a favorable tensile stress level, the $Al_2O_3$ layer a certain important crystallographic feature and a top surface with an excellent surface finish.

The mentioned combination with the blasting technique effectively expands the limitations of what coating thickness that can be applied without performance penalty. As a result of the invention application areas of unsurpassed width is now possible. The significant improvements achieved with respect to toughness behavior and coating adhesion is surprising.

To significantly change the stress state of a coating by blasting, the blasting media, e.g., $Al_2O_3$ grits have to strike the coating surface with a high impulse. The impact force can be controlled by, e.g., the blasting pulp pressure (wet blasting), the distance between blasting nozzle and coating surface, grain size of the blasting media, the concentration of the blasting media and the impact angle of the blasting jet.

The present invention thus relates to coated cutting tool inserts comprising a body, usually of generally polygonal or round shape having at least one rake face and at least one clearance face comprising a coating and a carbide substrate. The body has a composition of from about 6.4 to about 8.6, preferably from about 7.0 to about 8.0, most preferably from about 7.0 to about 7.8, wt-% Co, from about 4 to about 8.5 wt-% cubic carbides, balance WC, a CW-ratio in the range from about 0.78 to about 0.92 and a surface zone of a thickness of from about 10 to about 35 μm, preferably from about 15 to about 25 μm, depleted from the cubic carbides TiC, TaC and/or NbC. The coating comprises at least one $TiC_xN_y$-layer and one well-crystalline layer of 100% α-$Al_2O_3$. One such α-$Al_2O_3$ layer is the top visible layer on the rake face and along the cutting edge line and it can be intensively wet blasted with a sufficiently high energy to create a tensile stress relaxation in both the $Al_2O_3$ and the $TiC_xN_y$-layers. The $Al_2O_3$ top layer has a very smooth surface at least in the chip contact zone on the rake face.

It has surprisingly been discovered that a significant improved toughness performance can be achieved if a coated cutting tool insert having at least one rake face and at least one clearance face said insert being at least partly coated produced to possess the following features:

a penultimate $TiC_xN_y$ layer with a thickness of from about 5 to about 15 μm, preferably from about 6 to about 13 μm, most preferably from about 7 to about 13 μm, where x≧0, y≧0 and x+y=1, preferably produced by MTCVD, with tensile stresses of from about 50 to about 390 MPa, preferably from about 50 to about 300 MPa, most preferably from about 50 to about 220 MPa and an outer α-$Al_2O_3$-layer with a thickness of from about 3 to about 12 μm, preferably from about 3.5 to about 8 μm, most preferably from about 4 to about 8 μm, being the top layer on the rake face and along the edge line having a mean roughness Ra<0.12, preferably ≦0.1 μm, at least in the chip contact zone of the rake face, measured over an area of 10 μm×10 μm by Atomic Force Microscopy (AFM) and an XRD-diffraction intensity (peak height minus background) ratio of I(012)/I(024)≧1.3, preferably ≧1.5.

Preferably, there is a bonding layer of $TiC_xN_yO_z$, x≧0, z>0 and y≧0 between the $TiC_xN_y$-layer and the α-$Al_2O_3$-layer. The total thickness of the two layers is less than or equal to 25 μm.

Additional layers can be incorporated into the coating structure between the substrate and the layers according to the present invention composed of metal nitrides and/or carbides and/or oxides with the metal elements selected from Ti, Nb, Hf, V, Ta, Mo, Zr, Cr, W and Al to a total coating thickness of less than 5 μm.

It is preferred to have some tensile stresses left in the $TiC_xN_y$ layer since it was found that if compressive stresses were to be induced by blasting, very high blasting impact force was required and under such conditions flaking of the coating frequently occurred along the cutting edge. It was also found that such induced compressive stresses were not as stable with respect to temperature increase, which occurs in a cutting operation as compared to if the coating has some tensile stresses still present.

The residual stress, σ, of the inner $TiC_xN_y$ layer is determined by XRD measurements using the well known $\sin^2\psi$ method as described by I. C. Noyan, J. B. Cohen, Residual Stress Measurement by Diffraction and Interpretation, Springer-Verlag, New York, 1987 (pp 117-130). The measurements are performed using $CuK_\alpha$-radiation on the $TiC_xN_y$ (422) reflection with a goniometer setup as shown in FIG. 1. The measurements are carried out on an as flat surface as possible. It is recommended to use the side-inclination technique (ψ-geometry) with six to eleven ψ-angles, equidistant within a $\sin^2\psi$-range of 0 to 0.5 (ψ=45°). An equidistant distribution of Φ-angles within a Φ-sector of 90° is also preferred. To confirm a biaxial stress state the sample shall be rotated for Φ=0° and 90° while tilted in ψ. It is recommended to investigate possible presence of shear stresses and therefore both negative and positive ψ-angles shall be measured. In the case of an Euler ¼-cradle this is accomplished by measuring the sample also at Φ=180° and 270° for the different ψ-angles. The $\sin^2\psi$ method is used to evaluate the residual stress preferably using some commercially available software such as DIFFRAC$^{Plus}$ Stress32 v. 1.04 from Bruker AXS with the constants Young's modulus, E=480 GPa and Poisson's ratio, ν=0.20 in case of a MTCVD Ti(C,N)-layer and locating the reflection using the Pseudo-Voigt-Fit function. In the case of the following parameters are used: E-modulus=480 GPa and Poisson's ratio ν=0.20. In case of a biaxial stress state the tensile stress is calculated as the average of the obtained biaxial stresses.

For the α-Al$_2$O$_3$ layer, it is in general not possible to use the sin$^2$ψ technique since the required high 2θ angle XRD-reflections are often too weak. However, a useful alternative measure has been found which relates the state of the α-Al$_2$O$_3$ to cutting performance.

For an α-Al$_2$O$_3$ powder, the diffraction intensity ratio I(012)/I(024) is close to 1.5. Powder Diffraction File JCPDS No 43-1484 states the intensities I$_0$(012)=72 and I$_0$(024)=48. For tensile stressed (with σ greater than about 350 MPa) CVD α-Al$_2$O$_3$-layers on cemented carbide, the intensity ratio I(012)/I(024) is surprisingly significantly less than the expected value 1.5 and most often <1. This may be due to some disorder in the crystal lattice caused by the tensile stresses. It has been found that when such a layer is stress released by, e.g., an intense blasting operation or if it has been completely removed from the substrate and powdered, the ratio I(012)/I(024) becomes closer, equal or even higher than 1.5, dependent. The higher the applied blasting force the higher the ratio will be. Thus, this intensity ratio can be used as an important state feature of an α-Al$_2$O$_3$ layer.

According to the present invention, a cutting tool insert is provided with a CVD-coating comprising a penultimate TiC$_x$N$_y$-layer and an outer α-Al$_2$O$_3$-layer. The Al$_2$O$_3$ can be produced according to patent EP 0603144 giving the Al$_2$O$_3$-layer a crystallographic texture in 012-direction with a texture coefficient TC(012)>1.3, preferably >1.5 or produced according to U.S. Pat. No. 5,851,687 and U.S. Pat. No. 5,702,808 giving a texture in the 110-direction with texture coefficient TC(110)>1.5. In order to obtain a high surface smoothness and low tensile stress level, the coating is subjected to a wet blasting operation with a slurry consisting of F150 grits (FEPA-standard) of Al$_2$O$_3$ in water at an air pressure of 2.2-2.6 bar for about 10-20 sec/insert. The spray guns are placed approximately 100 mm from the inserts with a 90° spray angle. The insert has a different color on the clearance side than on the black rake face. An outermost thin 0.1-2 μm coloring layer of TiN (yellow), TiC$_x$N$_y$ (grey or bronze), or ZrC$_x$N$_y$ (reddish or bronze), where x≧0, y≧0 and x+y=1 or TiC (grey) is preferably deposited. The inserts are then blasted removing the top layer exposing the black Al$_2$O$_3$ layer. The coating on the rake face will have the low desired tensile stress from about 50 to about 390 MPa while the clearance side will have high tensile stresses in the range from about 500 to about 700 MPa dependent on the choice of coating and the coefficient of Thermal Expansion (CTE) of the cemented carbide insert used. In an other embodiment of the invention, the coated insert is blasted both on the rake face and the clearance side and a colored heat resistant paint is sprayed on the clearance side or a colored PVD layer is deposited there in order to obtain a possibility to identify a used cutting edge.

The invention is additionally illustrated in connection with the following examples, which are to be considered as illustrative of the present invention. It should be understood, however, that the invention is not limited to the specific details of the examples.

Example 1

A) Cemented carbide cutting inserts with the composition 7.5 wt-% Co, 2.9 wt-% TaC, 0.5 wt-% NbC, 1.9 wt-% TiC, 0.4 wt-% TiN, balance WC, with a surface zone (22 μm) depleted from cubic carbides. The saturation magnetization, M$_s$, was measured to be 0.099 hAm$^2$/kg giving a CW-ratio of 0.82. The inserts were coated with a 0.5 μm thick layer of TiN using conventional CVD-technique at 930° C. followed by a 9 μm TiC$_x$N$_y$ layer employing the MTCVD-technique using TiCl$_4$, H$_2$, N$_2$ and CH$_3$CN as process gases at a temperature of 885° C. In subsequent process steps during the same coating cycle a layer of TiC$_x$O$_z$ about 0.5 μm thick was deposited at 1000° C. using TiCl$_4$, CO and H$_2$, and then the Al$_2$O$_3$-process was stared up by flushing the reactor with a mixture of 2% CO$_2$, 3.2% HCl and 94.8% H$_2$ for 2 min before a 7 μm thick layer of α-Al$_2$O$_3$ was deposited. On top was a thin approx. 0.5 μm TiN layer deposited. The process conditions during the deposition steps were as below:

|  | TiN | TiC$_x$N$_y$ | TiC$_x$O$_z$ | Al$_2$O$_{3-start}$ | Al$_2$O$_3$ |
|---|---|---|---|---|---|
| Step | 1 and 6 | 2 | 3 | 4 | 5 |
| TiCl$_4$ | 1.5% | 1.4% | 2% | | |
| N$_2$ | 38% | 38% | | | |
| CO$_2$ | | | | 2% | 4% |
| CO | | | 6% | | |
| AlCl$_3$: | | | | | 3.2% |
| H$_2$S | | | | | 0.3% |
| HCl | | | | 3.2% | 3.2% |
| H$_2$: | balance | balance | balance | balance | balance |
| CH$_3$CN | — | 0.6% | | | |
| Pressure | 160 mbar | 60 mbar | 60 mbar | 60 mbar | 70 mbar |
| Temp.: | 930° C. | 885° C. | 1000° C. | 1000° C. | 1000° C. |
| Time: | 30 min | 6 h | 20 min | 2 min | 7 h |

XRD-analysis of the deposited Al$_2$O$_3$ layer showed that it consisted only of the α-phase with a texture coefficient TC(012)=1.4 defined as below:

$$TC(102) = \frac{I(102)}{I_o(102)} \left\{ \frac{1}{n} \sum \frac{I(hkl)}{I_o(hkl)} \right\}^{-1}$$

where
I(hkl)=measured intensity of the (hkl) reflection
I$_O$(hkl)=standard intensity of Powder Diffraction File JCPDS No 43-1484.
n=number of reflections used in the calculation
(hkl) reflections used are: (012), (104), (110), (113), (024), (116).

Example 2

Coated inserts from examples 1 were post treated by the earlier mentioned blasting method under various conditions. The rake face of the inserts were blasted. Four different blasting pressures 2.0, 2.2, 2.4 and 2.6 bar and different exposure times were used. Some inserts were also brushed with a nylon brush containing SiC grains in order to smooth the coating surface along and near the cutting edge and some inserts were blasted according to U.S. Pat. No. 5,861,210. The coatings of the different post-treated inserts were examined in a Scanning Microscope (SEM) at high magnification. It was evident from the examination that some of the inserts blasted at 2.6 bar showed some minor dots of flaking of the coating at the cutting edges.

The smoothness of the coating surface expressed as a well known roughness value Ra was measured by AFM on an equipment from Surface Imaging System AG (SIS) on all inserts except for the brushed and the nonblasted ones. The roughness was measured on ten randomly selected plane surface areas (10 μm×10 μm) in the chip contact zone on rake face. The mean value from these ten Ra values was used as the roughness value here named mean Ra (MRa) in table 1 below.

X-ray Diffraction Analysis using a Bragg-Brentano diffractometer, Siemens D5000, was used to determine the I(012)/I(024)-ratio using Cu Kα-radiation.

The obtained I(012)/I(024)-ratio on the clearance side were <1.5 for all variants. Corresponding measurements for the rake faces, as seen in Table 1.

The residual stress was determined using ψ-geometry on an X-ray diffractometer Bruker D8 Discover-GADDS equipped with laser-video positioning, Euler ¼-cradle, rotating anode as X-ray source (CuK$_\alpha$-radiation) and an area detector (Hi-star). A collimator of size 0.5 mm was used to focus the beam. The analysis was performed on the TiC$_x$N$_y$ (422) reflection using the goniometer settings 2θ=126°, ω=63° and Φ=0°, 90°, 180°, 270°, Eight ψ tilts between 0° and 70° were performed for each Φ-angle. The sin²ψ method was used to evaluate the residual stress using the software DIFFRAC$^{Plus}$ Stress32 v. 1.04 from Bruker AXS with the constants Young's modulus, E=480 GPa and Poisson's ratio, ν=0.20 and locating the reflection using the Pseudo-Voigt-Fit function. A biaxial stress state was confirmed and the average value was used as the residual stress value. Measurements were carried out both on the rake face and the clearance side. The obtained tensile stresses on the clearance side were within 500-700 MPa for all variants, corresponding measurements for the rake faces se table 1.

Example 3

Inserts with the different post-treatments were tested in a cutting operation with high toughness demands properties. The following conditions were used:

| Dry condition | |
| --- | --- |
| Cutting speed | V = 120 m/min |
| Feed rate f(t, min) | f = 0.15 * (1 + t/1.5) mm/rev |
| Depth of cut | a = 1.5 mm |
| Number of repetitions | = 10 |

TABLE 1

| Variant | Pressure, bar/ Blasting time, s | Mean Ra-Value MRa | Median time to fracture (Minutes) | I(012)/ I(024) Al$_2$O$_3$ Layer | Stress in TiC$_x$N$_y$ Layer |
| --- | --- | --- | --- | --- | --- |
| A | Brushed | — | 0.84 | 0.8 | 565 |
| B | 2.0/5 | 0.13 | 1.27 | 1.1 | 440 |
| C | 2.0/10 | 0.11 | 1.49 | 1.3 | 383 |
| D | 2.0/20 | 0.11 | 1.67 | 1.4 | 330 |
| E | 2.2/10 | 0.10 | 1.92 | 1.6 | 274 |
| F | 2.4/10 | 0.09 | 2.05 | 1.9 | 213 |
| G | 2.4/20 | 0.08 | 2.73 | 2.2 | 185 |
| H | 2.6/10 | 0.09 | 2.61 | 2.3 | 55 |

B = Blasted according to U.S. Pat. No. 5,861,210 with Al$_2$O$_3$ grits 150 mesh.
C-H = Blasted according to example 2.

The results from the cutting tests clearly show that the best toughness performance is achieved with the variants E, F, G and H which have the lowest tensile stresses in the TiC$_x$N$_y$ layer. Values C and D also have stress values significantly below those of the prior art. The highest I(012)/I(024) ratio of the Al$_2$O$_3$-layer and low mean Ra-values. These facts show that there exists a certain parameter space of properties which is directly related to the lifetime of cutting tool insert. Consequently a number of conditions and features have to be present simultaneously in order to achieve the high performance of the cutting tool insert.

Example 4

Inserts produced according to E were tested against the high performance cutting grade GC4025 (by sales volume world's largest steel cutting grade) in an end user operation producing crankshafts. The operation involved interrupted cuts and thereby testing the toughness of the inserts.

Figure 2:
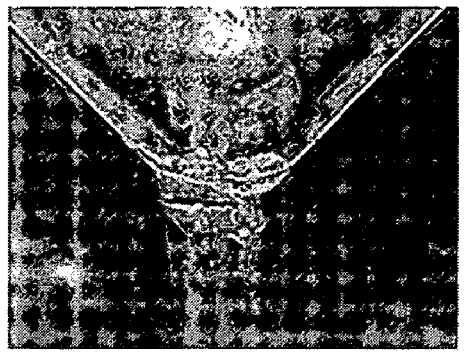
FIG. 2 shows the wear pattern of an insert according to prior art and
FIG. 3 that of an insert according to the present invention when subjected to a certain performance test.

The GC4025 insert suffered after 31 components a pronounced fractured edge FIG. 1 while the insert produced according to E managed 41 components with only minor edge chipping FIG. 2.

Example 5

Figure 3:
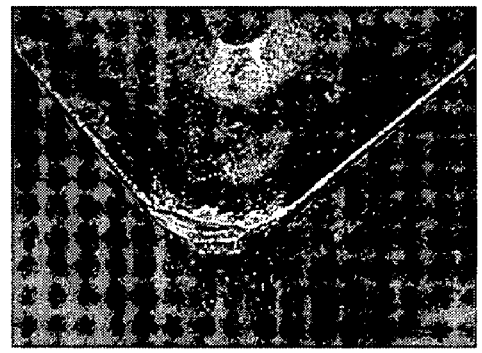
Figure 4:
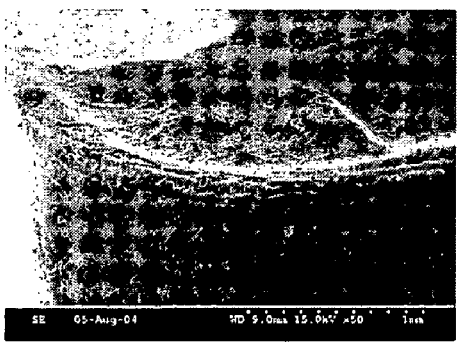
FIG. 4. shows the result of a flaking test of an insert according to prior art and
FIG. 5. that of an insert according to the present invention.
Figure 5:
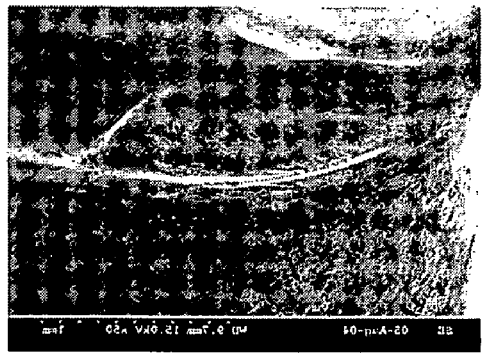

In another machining test comparing E and GC4025 in case hardened steel at an end user the difference in flaking resistance is illustrated in FIGS. 3 and 4. Also in this case the insert produced according to the invention proved itself superior to prior art produced inserts.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. A coated cutting tool insert of cemented carbide comprising a body having at least one rake face and at least one clearance face, said insert having a composition of from about 6.4 to about 8.6 wt-% Co, from about 4 to about 8.5 wt-% cubic carbides, balance WC, a CW-ratio in the range from about 0.78 to about 0.92 and having a surface zone of a thickness of from about 10 to about 35 μm, depleted of the cubic carbides TiC, TaC and/or NbC, said insert being at least partly coated with a from about 10 to about 25 μm thick coating including at least one layer of TiC$_x$N$_y$, wherein x≧0, y≧0, and x+y=1, and an α-Al$_2$O$_3$-layer, wherein the coating on said at least one rake face includes:
the TiC$_x$N$_y$-layer having a thickness of from about 5 to about 15 μm, and a tensile stress level of from about 50 to about 390 MPa; and
the α-Al$_2$O$_3$-layer having a thickness of from about 3 to about 12 μm and forming the outermost layer of the coating with an XRD-diffraction intensity ratio I(012)/I(024)≧1.3 and with a mean Ra value MRa<0.12 μm, at least in the chip contact zone on the rake face, as measured on ten randomly selected areas 10×10 μm² by AFM-technique, and
wherein the coating on said at least one clearance face includes either:
the TiC$_x$N$_y$-layer having a tensile stress in the range from about 500 to about 700 MPa; and
the α-Al$_2$O$_3$-layer having an XRD-diffraction intensity ratio I(012)/I(024)<1.5 or
the TiC$_x$N$_y$-layer having a thickness of from about 5 to about 15 μm, and a tensile stress level of from about 50 to about 390 MPa;
the α-Al$_2$O$_3$-layer with a thickness of from about 3 to about 12 μm, has an XRD-diffraction intensity ratio I(012)/I(024)≧1.3; and
an outermost layer comprising a colored heat resistant paint or a colored PVD-layer.

2. A cutting tool insert of claim 1 wherein there is a thin, from about 0.2 to about 2 μm TiC$_x$N$_y$O$_z$ bonding layer between the TiC$_x$N$_y$- and the Al$_2$O$_3$-layer, wherein x≧0, z>0, and y≧0.

3. A cutting tool insert of claim 1 wherein the α-Al$_2$O$_3$-layer has a texture in the 012-direction with a texture coefficient TC(012)>1.3.

4. A cutting tool insert of claim 3 wherein the texture coefficient TC(012)>1.5.

5. A cutting tool insert of claim 1 wherein the α-$Al_2O_3$-layer having a texture in the 110-direction with a texture coefficient TC(110)>1.5.

6. A cutting tool insert of claim 1 wherein the coating contains additional layers composed of metal nitrides and/or carbides and/or oxides with the metal elements selected from Ti, Nb, Hf, V, Ta, Mo, Zr, Cr, W and Al to a total layer thickness of less than about 5 μm.

7. A cutting tool insert of claim 1 wherein said insert has a generally polygonal or round shape.

8. A cutting tool insert of claim 1 wherein the Co content of said insert is from about 7.0 to about 7.8 wt-%.

9. A cutting tool insert of claim 1 wherein the thickness of said surface zone is from about 15 to about 25 μm.

10. A cutting tool insert of claim 1 wherein said $TiC_xN_y$-layer is deposited by MTCVD.

11. A cutting tool insert of claim 1 wherein said α-$Al_2O_3$-layer is covered with a thin, from about 0.1 to about 2 μm layer which gives a different color to that face.

12. A cutting tool insert of claim 1 wherein α-$Al_2O_3$-layer is covered with $TiC_xN_y$, TiN, $ZrC_xN_y$, or TiC layer, wherein $x \geq 0$, $y \geq 0$, and $x+y=1$.

13. A cutting tool insert of claim 1 wherein said $TiC_xN_y$-layer has a thickness of from about 6 to about 13 μm and said α-$Al_2O_3$-layer has a thickness of from about 3.5 to about 8 μm.

14. A cutting tool insert of claim 1, wherein the outer layer at least on the rake face has an XRD-diffraction intensity ratio I(012)/I(024)≧1.5.

15. A cutting tool insert of claim 1, wherein the mean Ra value of the α-$Al_2O_3$-layer is MRa≦0.1 μm.

16. The cutting tool of claim 1, wherein the coating on the at least one rake face includes a $TiC_xN_y$-layer having a tensile stress level of from about 50 to about 220 MPa.

* * * * *